United States Patent
Webster

Patent Number: 5,273,203
Date of Patent: Dec. 28, 1993

[54] CERAMIC-TO-CONDUCTING-LEAD HERMETIC SEAL

[75] Inventor: Harold F. Webster, Scotia, N.Y.

[73] Assignee: General Electric Company, Schenectady, N.Y.

[21] Appl. No.: 38,418

[22] Filed: Mar. 29, 1993

Related U.S. Application Data

[62] Division of Ser. No. 454,548, Dec. 21, 1989.

[51] Int. Cl.$^5$ .............................. H01J 9/32; H01J 9/40
[52] U.S. Cl. ................... 228/124.6; 228/198; 228/255; 174/152 GM
[58] Field of Search ............ 174/152 GM, 52.4; 257/698; 228/122, 124, 198, 255

[56] References Cited

U.S. PATENT DOCUMENTS

| | | | |
|---|---|---|---|
| 3,336,433 | 8/1967 | Johnson et al. | 174/52.5 |
| 3,419,762 | 12/1968 | Lucas | 257/698 |
| 3,744,120 | 7/1973 | Burgess et al. | 228/198 |
| 3,766,634 | 10/1973 | Babcock et al. | 228/188 |
| 3,854,892 | 12/1974 | Burgess et al. | 428/640 |
| 3,901,772 | 8/1975 | Guillotin et al. | 228/122 |
| 3,911,553 | 10/1975 | Burgess et al. | 228/173.1 |
| 3,929,426 | 12/1975 | Blust et al. | 228/122 |
| 3,950,142 | 4/1976 | Brenan et al. | 257/698 |
| 3,970,235 | 7/1976 | Blust et al. | 228/122 |
| 3,993,411 | 11/1976 | Babcock et al. | 403/271 |
| 3,994,430 | 11/1976 | Cusano et al. | 228/122 |
| 4,129,243 | 12/1978 | Cusano et al. | 228/122 |
| 4,217,137 | 8/1980 | Kraska et al. | 228/122 X |
| 4,409,278 | 10/1983 | Johym | 428/163 |
| 4,560,826 | 12/1985 | Burns et al. | 174/52.4 |
| 4,563,383 | 1/1986 | Kuneman et al. | 428/216 |
| 4,610,756 | 9/1986 | Strobel | 174/258 |

FOREIGN PATENT DOCUMENTS

| | | |
|---|---|---|
| 0165746 | 8/1985 | Japan. |
| 2196568 | 4/1988 | United Kingdom. |

*Primary Examiner*—Kenneth J. Ramsey
*Attorney, Agent, or Firm*—Marvin Snyder; Geoffrey H. Krauss

[57] ABSTRACT

A hermetic seal is provided for a conductive feedthrough through a thin ceramic component by a platinum or palladium lead by sealing the gap between the lead and the ceramic with a copper-copper oxide eutectic. The lead may have a copper coating on it prior to and subsequent to formation of the copper-copper oxide eutectic.

5 Claims, 1 Drawing Sheet

CERAMIC-TO-CONDUCTING-LEAD HERMETIC SEAL

This application is a division of application Ser. No. 07/454,548, filed Dec. 21, 1989.

BACKGROUND OF THE INVENTION

1. Field of the Invention

The present invention relates to the field of electronic packages, and more particularly, to the field of hermetically sealed electronic packages.

2. Background Information

For many applications, it is either desired or necessary to provide a hermetically sealed package for electronic devices In the case of vacuum tubes, a hermetic seal is essential to the proper operation of the device. With semiconductor devices, a hermetically sealed package is considered necessary or desirable for semiconductor devices for which high reliability is required or which will be exposed to hostile environments. One of the problem areas in providing a hermetically sealed package is provision of hermetic seals between leads which extend from within the hermetically sealed portion of the package to outside the package enclosure. Over the years, many different lead and seal combinations have been developed in an attempt to provide hermetically sealed packages. These efforts have included the development of special metal alloys whose thermal coefficients of expansion are similar to that of the electrically insulating material through which the lead must pass along with the development of special sealing materials having substantially matched coefficients of thermal expansion such as special composition glasses for sealing the gap between the lead and the insulating body of the package.

One type of hermetically sealed package is disclosed in patent application Ser. No. 367,525, filed Jun. 16, 1989, entitled "Hermetic Package Having a Lead Extending Through an Aperture in the Package Lid and Packaged Semiconductor Chip", now U.S. Pat. No. 5,103290 by V. A. K. Temple et al. In that package, apertures in a ceramic package lid are hermetically sealed by a direct bond between the ceramic lid and a copper foil which extends across an aperture in the lid. The direct bond copper process used to form this copper foil-to-ceramic seal or bond is described in U.S. Pat. Nos. 3,744,120, 3,854,892 and 3,911,553 to Burgess et al.; U.S. Pat. Nos. 3,766,634 and 3,993,411 to Babcock et al.; U.S. Pat. Nos. 3,994,430 and 4,129,243 to Cusano et al.; U.S. Pat. No. 4,409,278 to Jochym; and U.S. Pat. No. 4,563,383 to Kuneman et al. Each of these patents is incorporated herein by reference. These direct bond patents teach that copper-copper oxide, nickel-nickel oxide, cobalt-cobalt oxide, iron-iron oxide and copper-copper sulfide eutectics can be used to form bonds of this type. This bond is formed by a copper-copper oxide eutectic mixture which wets both metallic copper and ceramic materials such as alumina and beryllia and which bonds the members together upon solidification. This copper-copper oxide eutectic process has been in use for many years in the electronic arts.

As discussed in application Ser. No. 367,525, it has been found that the copper foil must be direct bonded to the ceramic over a distance of about 100 mils in order to ensure the formation of a hermetic seal. This places a limit on the minimum spacing between electrically isolated leads. For some applications, the resulting minimum center-to-center spacing of leads is a severe disadvantage. A variation on that package is the subject of patent application Ser. No. 375,636, filed Jul. 3, 1987, and entitled "Hermetic Package and Package Semiconductor Chip Having Closely Spaced Leads Extending Through the Package Lid" now U.S. Pat. No. 5,166,773 by V. A. K. Temple et al.

Application Ser. No. 375,636 substantially reduces the spacing required between adjacent leads as compared to application Ser. No. 367,525. However, the minimum center-to-center lead spacing is still greater than is desirable for many applications.

Consequently, there is a need for an improved hermetic seal between a ceramic package component and a lead passing therethrough which requires less package component area per lead.

OBJECTS OF THE INVENTION

Accordingly, a primary object of the present invention is to provide an improved lead-to-ceramic hermetic seal which reduces the required seal path length for achieving a hermetic seal.

Another object of the present invention is to provide a ceramic package having improved hermetic seals between the package components and conductive leads passing therethrough.

SUMMARY OF THE INVENTION

The above and other objects which will become apparent from the specification as a whole, including the drawings, are accomplished in accordance with a preferred embodiment of the present invention by providing a lead having a platinum or palladium core and a copper sheath extending through an alumina or beryllia substrate and hermetically sealing the aperture between the ceramic and the lead with a copper-copper oxide eutectic. This hermetic seal may be provided by coating the platinum or palladium core with copper, inserting the lead in an appropriately sized aperture in the ceramic and passing the combination through a direct bond copper furnace temperature profile in an appropriate atmosphere to form the copper-copper oxide eutectic which flows into any gaps between the lead and the ceramic and seals those gaps. Alternatively, a copper collar may be provided on a platinum or palladium lead with the collar disposed adjacent the ceramic. When this structure is passed through a direct bond copper process, the liquid eutectic flows into and seals the lead-to-ceramic gap upon solidification.

BRIEF DESCRIPTION OF THE DRAWINGS

The subject matter which is regarded as the invention is particularly pointed out and distinctly claimed in the concluding portion of the specification. The invention, however, both as to organization and method of practice, together which further objects and advantages thereof, may best be understood by reference to the following description taken in connection with the accompanying drawings in which:

DETAILED DESCRIPTION

Figure 1:
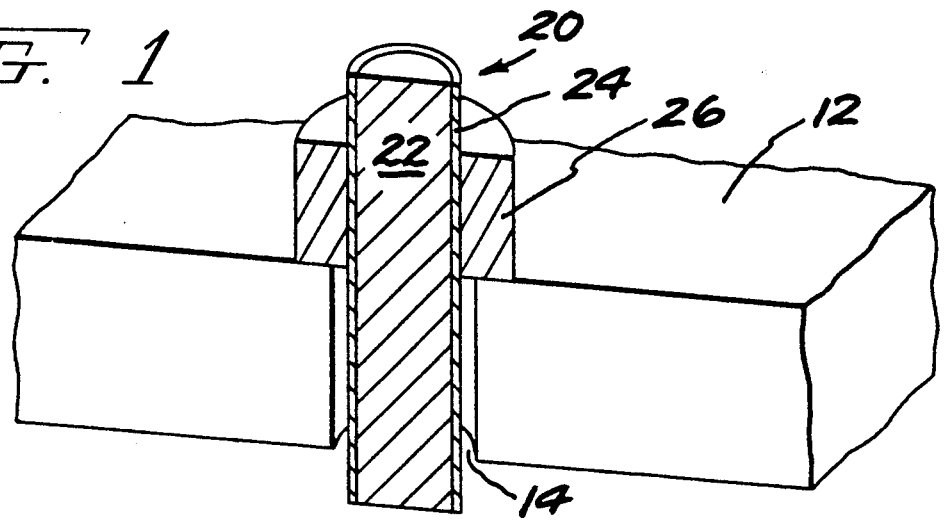
FIG. 1 illustrates a ceramic package component and lead in accordance with the present invention prior to sealing the lead to the ceramic.
Figure 2:
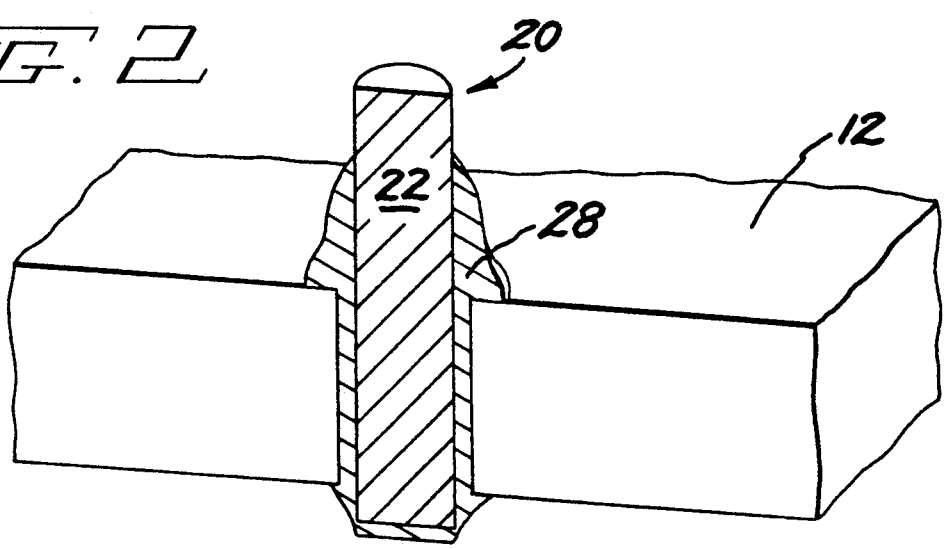
FIG. 2 illustrates a ceramic package component and lead in accordance with the present invention after hermetic sealing of the lead to the ceramic.

In FIG. 1, a lead 20 ready for sealing in a ceramic package component 12 in accordance with the present invention is illustrated in a perspective cross-section view. A ceramic substrate 12 which may be alumina, beryllia or other appropriate materials may preferably be on the order of 25 mils (635 microns) thick and may have an aperture 14 which is 24 mils (610 microns) or 44 mils (1.12 mm) in diameter therein, extending through the ceramic component 12 between its major surfaces. The aperture diameter may be made larger or smaller as may be considered desirable. The lead 20 has a platinum core 22 which may be either 20 mils (508 microns) or 40 mils (1.02 mm) in diameter having a thin copper plating 24 which may be approximately 1 mil (25.4 microns) in thickness sheathing the platinum core. It is preferred to provide a copper collar 26 which is a press fit on the lead 20 and has a cylindrical shell thickness of, for example, 10 mils (254 microns) and a height of 25 mils (635 microns) and is disposed adjacent the ceramic component 12. The copper collar 26 is preferred in order to ensure the formation of sufficient eutectic material to seal the gap between the lead 20 and the ceramic 12 surrounding the aperture 14.

With the components disposed in the manner illustrated, the combined structure is passed through a copper direct bond thermal profile in accordance with the process taught in the above-identified direct bond copper process patents In particular, the copper collar and plated platinum rod are heated in air at about 340° C. for several minutes to oxidize the copper to provide the oxygen necessary for the formation of the copper-copper oxide eutectic. The alumina plate 12 is preferably fired in air at about 940° C. for 10 minutes prior to assembly with the lead 20 and collar 26 in order to ensure that any unwanted residues from drilling and cleaning processes are removed prior to performing the bonding process. Following the preparatory steps, the assembled structure is heated to between 1,065° C. and 1,083° C. whereby a liquid, copper-copper oxide eutectic 28 forms, flows into the gap between the lead 20 and the ceramic 12 and fills that gap. The combined structure is then cooled to less than 1,065° C. to solidify the copper-copper oxide eutectic, thereby effecting a hermetic seal between the platinum rod and the ceramic. The combined structure is then cooled to ambient temperature for assembly into the final desired package. The platinum rod has a thermal coefficient of expansion of substantially $8.6 \times 10^{-6}/°C.$, while the alumina substrate (96% alumina) has a thermal coefficient of expansion of 6 to $8 \times 10^{\times 6}/°C.$ Thus, the platinum and alumina are closely matched in thermal expansion coefficients with the result that the lead-to-ceramic seal should have a long, useful life, even in the presence of substantial thermal cycling.

This same process has been carried out using a solid copper lead in place of the copper plated platinum lead. The resulting seal is not hermetic. The copper has a thermal coefficient of expansion of $17 \times 10^{-6}/°C.$ which differs substantially from that of alumina. Consequently, the failure of the all-copper lead to produce a hermetic seal is believed to be at least partially due to contraction of the lead during cooling with a resulting fracturing of any hermetic seal initially formed. Palladium, whose thermal coefficient of expansion is $11 \times 10^{-6}/°C.$, may also be used as the core of the lead.

Figure 3:
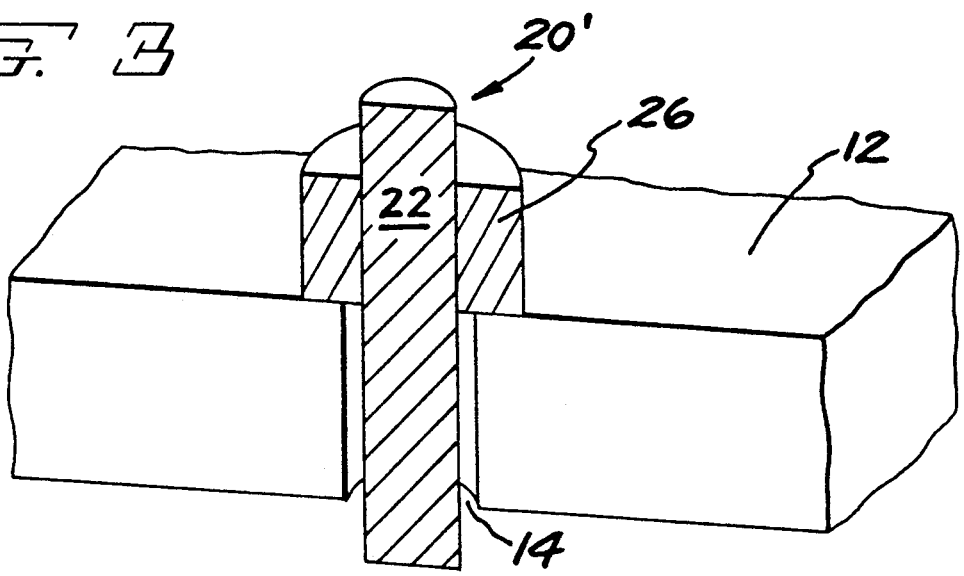
FIG. 3 illustrates an uncoated platinum or palladium lead disposed in an aperture in a ceramic with a copper collar in place for providing the eutectic to seal the lead to the ceramic.

A lead 20' is illustrated ready for bonding in a ceramic substrate 12 in FIG. 3 in accordance with an alternative embodiment of the invention. In this embodiment, the lead 20 is solid platinum or palladium and is free of copper coatings of the type present in the FIG. 1 structure. The copper collar 26 is disposed in direct contact with the platinum or palladium lead 20, but no copper is present on the surface of the portion of the lead which extends into the aperture 14 in the ceramic 12. With appropriate pre-oxidation of the copper collar or the presence of an appropriate oxidizing atmosphere during passage of this structure through a direct bond temperature profile, the collar 26 produces a sufficient quantity of the copper/copper oxide liquid eutectic for that eutectic to flow into and fill the gap between the lead 22 and the ceramic substrate 12. Upon solidification, this copper/copper eutectic forms a hermetic seal between the lead 22 and the ceramic substrate 12. Once the lead is sealed to the ceramic with this eutectic, the lead and substrate appear very similar, if not identical, to the final structure when made from a copper coated lead. This is because the copper/copper oxide eutectic has a high affinity for platinum and palladium and, therefore, normally coats the surface of the platinum or palladium lead.

While the specific examples have been discussed in terms of either a platinum or a palladium lead, it will be understood that leads which are a mixture of platinum and palladium may be used as may leads which have a sufficient platinum or palladium content to provide good adherence by the copper/copper oxide eutectic in combination with a suitably low coefficient of thermal expansion. Thus, other lead materials than just platinum or palladium may be used in accordance with this invention.

This hermetic seal is unique because of the small thickness (630 microns) of the alumina substrate. It is further highly advantageous since for a 20 mil (50 micron) diameter lead, leads may be placed 30 mils (762 microns) on center, thereby providing the ability to provide extremely closely spaced hermetic feedthroughs in a package lid or other component.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A method of hermetically sealing an aperture in a ceramic member comprising:
   disposing a conducting body comprising platinum or palladium in said aperture;
   providing a precursor to a copper-copper oxide eutectic adjacent to said body;
   heating said ceramic member, said conducting body and said precursor to a temperature at which a liquid copper-copper oxide eutectic forms, wets said body and fills any gaps between said conducting body and said ceramic member; and
   allowing said ceramic member, conducting body and eutectic to cool so that said eutectic solidifies and seals said aperture.

2. The method recited in claim 1 wherein:

said conducting body comprising platinum or palladium having a copper coating thereon.

3. The method recited in claim 1 wherein:
said conducting body has a platinum or palladium exposed surface;
said precursor comprises a copper collar disposed around said body external to said aperture.

4. The method recited in claim 3 wherein:
said external surface of said collar has a coating of copper oxide thereon.

5. The method recited in claim 1 wherein:
the step of providing is performed prior to the step of disposing.

* * * * *